(12) United States Patent
Huang et al.

(10) Patent No.: US 7,962,115 B2
(45) Date of Patent: Jun. 14, 2011

(54) CIRCUIT WITH PROGRAMMABLE SIGNAL BANDWIDTH AND METHOD THEREOF

(75) Inventors: Ming-Feng Huang, Hsinchu County (TW); Ming-Hau Tseng, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 680 days.

(21) Appl. No.: 12/025,784

(22) Filed: Feb. 5, 2008

(65) Prior Publication Data

US 2009/0170466 A1    Jul. 2, 2009

(30) Foreign Application Priority Data

Dec. 31, 2007   (TW) ................................ 96151521 A

(51) Int. Cl.
*H04B 1/16* (2006.01)
*H03L 7/00* (2006.01)
(52) U.S. Cl. ...................... 455/325; 455/197.2; 455/262; 455/340; 327/142; 341/143
(58) Field of Classification Search .................. 455/323, 455/313, 325, 326, 150.1, 168.1, 169.1, 195.1, 455/197.1, 327, 197.2, 10, 185.1, 147, 176.1, 455/196.1, 199.1, 208–209, 213, 261–262, 455/306–307, 319–320, 338–340; 327/355, 327/554, 94, 142; 341/143–144
See application file for complete search history.

(56) References Cited

U.S. PATENT DOCUMENTS

| 5,640,698 | A | 6/1997 | Shen et al. | |
|---|---|---|---|---|
| 6,147,522 | A * | 11/2000 | Rhode et al. | 327/93 |
| 6,570,519 | B1 * | 5/2003 | Yang | 341/143 |
| 6,858,925 | B2 | 2/2005 | Wada et al. | |
| 6,882,310 | B1 | 4/2005 | Drentea | |
| 6,888,888 | B1 | 5/2005 | Tu et al. | |
| 6,959,049 | B2 | 10/2005 | Staszewski et al. | |
| 6,963,732 | B2 | 11/2005 | Muhammad et al. | |
| 7,006,813 | B2 | 2/2006 | Staszewski et al. | |
| 7,057,540 | B2 | 6/2006 | Muhammad et al. | |
| 7,079,826 | B2 | 7/2006 | Muhammad et al. | |
| 7,336,938 | B1 * | 2/2008 | Wong | 455/296 |
| 7,671,658 | B2 * | 3/2010 | Harada et al. | 327/355 |
| 2001/0040930 | A1 | 11/2001 | Abbey | |

(Continued)

FOREIGN PATENT DOCUMENTS

EP          0987559 A2        3/2000

(Continued)

OTHER PUBLICATIONS

Article titled "Advanced 'Fs/2' Discrete-Time GSM Receiver in 90-nm CMOS" authored by Joet et al., Solid-State Circuits Conference 2006. ASSCC 2006. IEEE Asian, pp. 371-374, Nov. 13-15, 2006.

(Continued)

*Primary Examiner* — Pablo N Tran
(74) *Attorney, Agent, or Firm* — Jianq Chyun IP Office

(57) ABSTRACT

A circuit with programmable signal bandwidth is provided. The circuit includes a first charge and discharge device, a first reset device, and a first variable capacitor device. The first reset device is coupled to the first charge and discharge device, and the first variable capacitor device is coupled to the first charge and discharge device. The first reset device is controlled by a discharge enable signal and used to provide a first discharge path. When the discharge enable signal turns off the first reset device, the first variable capacitor device generates a first total equivalent capacitor to the first charge and discharge device according to n reference signals, and n is an integer greater than 0.

25 Claims, 12 Drawing Sheets

U.S. PATENT DOCUMENTS

| | | | |
|---|---|---|---|
| 2003/0040294 A1* | 2/2003 | Staszewski et al. | 455/337 |
| 2003/0080888 A1 | 5/2003 | Muhammad et al. | |
| 2004/0242175 A1* | 12/2004 | Lin | 455/147 |
| 2005/0036572 A1 | 2/2005 | Muhammad et al. | |
| 2005/0083231 A1 | 4/2005 | Drentea | |
| 2005/0104654 A1* | 5/2005 | Muhammad et al. | 327/552 |
| 2005/0144650 A1 | 6/2005 | Tu et al. | |
| 2005/0184828 A1* | 8/2005 | Son et al. | 333/174 |
| 2005/0233725 A1 | 10/2005 | Muhammad et al. | |
| 2009/0002066 A1* | 1/2009 | Lee et al. | 327/554 |

FOREIGN PATENT DOCUMENTS

| | | |
|---|---|---|
| EP | 813770 B1 | 4/2000 |
| EP | 1176708 A2 | 1/2002 |
| EP | 1411639 A2 | 4/2004 |
| GB | 2349783 A | 11/2000 |
| JP | 2008-005477 | 1/2008 |

OTHER PUBLICATIONS

Article titled "A 2.4-GHz RF Sampling Receiver Front-End in 0.18-um CMOS" authored by D. Jakonis et al., IEEE J. of Solid-State Circuits. vol. 40, No. 6, pp. 1265-1277, 2005.

"Office Action of Japan counterpart application", issued on Apr. 20, 2010, p. 1-p. 2.

* cited by examiner

US 7,962,115 B2

CIRCUIT WITH PROGRAMMABLE SIGNAL BANDWIDTH AND METHOD THEREOF

CROSS-REFERENCE TO RELATED APPLICATION

This application claims the priority benefit of Taiwan application serial no. 96151521, filed on Dec. 31, 2007. The entirety of the above-mentioned patent application is hereby incorporated by reference herein and made a part of this specification.

BACKGROUND OF THE INVENTION

1. Field of the Invention

The present invention generally relates to a wireless receiver circuit and a method thereof, in particular, to a circuit with programmable signal bandwidth and a method thereof.

2. Description of Related Art

Along with the progress of wireless communication technology, architectures of many recent wireless communication receivers are developed towards "light, thin, short, small" and power saving. Generally speaking, a front-end circuit of a receiver requires a high linearity, so as to improve the correctness of received signals demodulated and decoded by the whole receiver.

The progress of process technology enables many manufacturers to fabricate wireless communication receivers with small area and high speed. However, the available power supply voltage is dropped, and thus the linearity of an active circuit (e.g., an active amplifier) decreases. On the other hand, although the progress of the process can reduce the area of the wireless communication receiver, a ratio of capacitor area to the total area of the wireless communication receiver is increased instead of being reduced. Therefore, many manufacturers integrate a mix, a filter, and a sampler of a wireless communication receiver on the same circuit, so as to solve the above problems.

U.S. Pat. No. 6,963,732 B2 and No. 7,079,826 B2 have been granted to US Texas Instruments in 2005 and 2006, respectively. In the two patents, a switch and capacitor network is used to achieve sampling, filtering, and frequency down-conversion at the same time, and thus a better linearity can be obtained to a larger chip area is saved. However, the receivers disclosed in the two patents achieve the filtering effect only on narrowband signals, and folding noise generated during the sampling and frequency down-conversion reduces the overall performance of the system.

FIG. 1 is a systematic block diagram of a receiver 10 set forth by Texas Instruments. As shown in FIG. 1, the receiver 10 includes a low noise transconductance amplifier 11, a local oscillator 12, a digital control unit 13, a switch and capacitor network 14, an intermediate frequency amplifier 15, an analog signal processor 16, and an analog-to-digital converter 17. The coupling relation of the elements can be known with reference to FIG. 1, and will not be described herein again.

The low noise transconductance amplifier 11 receives a radio frequency signal RF_sig from a wireless channel, converts the received radio frequency signal RF_sig from a voltage signal to a corresponding current signal, and then amplifies the current signal. The local oscillator 12 generates an oscillation signal having a frequency similar to that of the radio frequency signal RF_sig to the digital control unit 13. The digital control unit 13 generates a plurality of clock control signals with different phases according to the oscillation signal to the switch and capacitor network 14, so as to control the charge and discharge of each capacitor in the switch and capacitor network 14. The switch and capacitor network 14 charges and discharges different capacitors included therein according to the clock signals with different phases, so as to achieve the purposes of sampling, filtering, and frequency down-conversion. The intermediate frequency amplifier 15 amplifies the signal in the intermediate frequency (IF) band output by the switch and capacitor network 14, and sends the amplified signal to the analog signal processing unit 16. The analog signal processing unit 16 performs an analog signal processing on the received signal, and sends the processed signal to the analog-to-digital converter 17. Finally, the analog-to-digital converter 17 converts the received analog signal into a digital signal, and the digital signal is a baseband signal BB_sig.

FIG. 2 is a circuit diagram of the switch and capacitor network 14 in the receiver 10. As shown in FIG. 2, the switch and capacitor network 14 includes a plurality of capacitors C, two load capacitors $C_A$, and a plurality of transistors. Control signals S1-S8, R1-R8, and SH1-SH8 are generated by the digital control unit 13 according to the oscillation signal output by the local oscillator 12. When the control signals SH1-SH8 turn on the controlled transistors, the capacitors C can be discharged through the transistors. With the circuit of FIG. 2, the switch and capacitor network 14 can achieve the sampling, filtering, and frequency down-conversion.

The receiver 10 adopts the architecture of the switch and capacitor network 14, such that the switch and capacitor network 14 can perform the sampling, filtering, and frequency down-conversion. However, the switch and capacitor network 14 will generate a first order infinite impulse response (First Order IIR) on the load capacitor $C_A$, such that the receiver 10 can only be used for filtering and receiving narrow band signals, and the folding noise generated during sampling and frequency down-conversion causes the decrease of the performance of the whole receiver 10. In addition, the higher the frequency of the oscillation signal is, the higher the power consumption of the local oscillator 12 will be. Since the frequency of the oscillation signal of the local oscillator 12 is similar to the frequency of the radio frequency signal RF_sig, the receiver 10 has larger power consumption.

FIG. 3 is a frequency response curve diagram of the switch and capacitor network 14. As shown in FIG. 3, the frequency response curve C00 of the switch and capacitor network 14 is comprised of a frequency response curve C01 of a finite impulse response (FIR) filter, a frequency response curve C02 of an IIR filter, and a frequency response curve of a FIR filter not shown. Since the switch and capacitor network 14 generates the IIR, the receiver 10 can only be used for filtering and receiving narrow band signals. In brief, the response of the frequency response curve C00 is equal to an equivalent response after two FIRs and an IIR.

Further, Jakonis et al. sets forth another architecture of receiver in June, 2005, see Darius Jakonis, Kalle Folkesson, Jerzy Dabrowski, and Christer Svenssson, "A 2.4 GHz RF Sampling Receiver Front End in 0.18 um CMOS", IEEE Journal of Solid-State Circuits, Vol. 40, No. 6, June, 2005. The receiver disclosed in this paper down-converts the input frequency to about ¼ of a sampling frequency, so as to generate an intermediate frequency signal, and then down-converts the intermediate frequency signal to a baseband signal. The principle thereof is using a sampling and holding mixer (S/H Mixer) and a filtering and frequency down-conversion device to achieve the purpose of sampling, filtering, and frequency down-conversion.

Then, FIG. 4 is a systematic block diagram of a receiver 20 set forth by Jakonis et al. As shown in FIG. 4, the receiver 20 includes an antenna 28, a radio frequency filter 21, a low noise amplifier 22, an S/H mixer 23, filtering and frequency down-conversion devices 24I, 24Q, a clock circuit 25, a local oscillator 26, and analog-to-digital converters 27I, 27Q. The coupling relation of the elements is shown in FIG. 4, which will not be described herein again.

The antenna 28 receives a radio frequency signal from a wireless channel, and sends the radio frequency signal to the radio frequency filter 21 for filtering. Then, the low noise amplifier 22 amplifies an output signal of the radio frequency filter 21, and sends the amplified output signal to the S/H mixer 23. The local oscillator 26 generates an oscillation signal to the clock circuit 25, and the clock circuit 25 generates a plurality of reference signals and a sampling signal. The frequency ratio of the sampling signal and the radio frequency signal is 4:9. The S/H mixer 23 samples the radio frequency signal, and mixes the sampling value and the sampling signal, so as to generate an intermediate frequency signal. The intermediate frequency signal is a discrete-time signal, and the frequency of the intermediate frequency signal is ¼ of the frequency of the sampling signal. Thereafter, the intermediate frequency signal enters the filtering and frequency down-conversion devices 24I, 24Q respectively, and the filtering and frequency down-conversion devices 24I, 24Q perform filtering and frequency down-conversion on the intermediate frequency signal respectively according to a plurality of reference signals, so as to generate an I channel baseband signal and a Q channel baseband signal. Finally, the analog-to-digital converters 27I, 27Q respectively convert the I channel baseband signal and the Q channel baseband signal into an I channel digital baseband signal and a Q channel digital baseband signal.

Then, FIG. 5 is a schematic view of spectrums of every frequency operation section of the receiver 20. Referring to FIGS. 5 and 4 together, in the RF section, i.e., before mixing the radio frequency signal, the frequency of the radio frequency signal is $f_c$, where $f_s$ is the sampling frequency, $f_{im}$ is the image frequency, $f_{IF}$ is the intermediate frequency, and $BW_{RF}$ is the bandwidth of the radio frequency signal. In the IF section, i.e., before filtering and down-converting the frequency of the intermediate frequency signal, the frequency of the intermediate frequency signal is $f_s/4$, where $f_{ADC}$ is the sampling frequency of the analog-to-digital converter. Finally, in the BB section, i.e., after filtering and down-converting the frequency of the intermediate frequency signal, the frequency of the baseband signal is 0, where $BW_{ch}$ is the bandwidth of the baseband signal, and $BW_{IF}$ is the bandwidth of the intermediate frequency signal.

Next, FIG. 6 is a sub circuit diagram of the filtering and frequency down-conversion devices 24I, 24Q. The filtering and frequency down-conversion devices 24I, 24Q are comprised of a plurality of sub circuits with different clock signals. As shown in FIG. 6, the sub circuit of the filtering and frequency down-conversion devices 24I, 24Q includes a plurality of transistors, and a plurality of capacitors $C_{n1}$-$C_{n6}$, $C_{p1}$-$C_{p5}$, $C_{Dn}$, and $C_{Dp}$. A plurality of reference signals $clk_1$-$clk_{24}$ and $clk_{D1}$-$clk_{D4}$ generated by the clock circuit 25 control the ON or OFF of a plurality of corresponding transistors in FIG. 6, so as to perform charging and charge integration on the capacitors $C_{n1}$-$C_{n6}$, $C_{p1}$-$C_{p5}$, $C_{Dn}$, and $C_{Dp}$. By controlling the charging and charge integration of the capacitors $C_{n1}$-$C_{n6}$, $C_{p1}$-$C_{p5}$, $C_{Dn}$, and $C_{Dp}$, finally, the signal of $OUT_n$ is subtracted from the signal of $OUT_p$ so as to obtain a baseband signal generated after the intermediate frequency signal is performed with the filtering and frequency down-conversion.

The receiver 20 first down-converts the input frequency to around ¼ of the sampling frequency to generating the intermediate frequency signal, and then down-converts the intermediate frequency signal to the baseband. However, the plurality of capacitors in the filtering and frequency down-conversion devices 24I, 24Q may generate IIR to the overall receiver due to the lack of discharging mechanism, which narrows the overall bandwidth, and is not suitable for the broadband transmission. In addition, the receiver 20 uses the S/H mixer 23, and the sampling frequencies in integer multiples may form folding noises, thereby affecting the overall performance of the receiver 20.

FIG. 7 is a frequency response curve diagram of the receiver 20. As shown in FIG. 7, assuming that the capacitance of the capacitor is set accurately, and the capacitor will not be influenced by the lack of discharge path to generate the IIR, a frequency response curve C03 of the entire receiver 20 is a broadband frequency response curve. In practice, under the influence of the lack of discharge path, the capacitance of the capacitor has errors, and thus the actual frequency response curve of the receiver 20 is a curve C04. That is to say, the actual frequency response curve C04 is the narrowband frequency response curve.

The conventional receivers 10, and 20 cannot achieve the broadband frequency response, and the current wireless communication receiver circuit is developed towards an integration of broadband, multimode, and multiple standards. Therefore, many providers and research institutions devote themselves to seeking a method for solving the problems.

SUMMARY OF THE INVENTION

The present invention is directed to a circuit with programmable signal bandwidth, which is not only applicable to receiving broadband signals, but also capable of programming bandwidth of the frequency response through a plurality of control signals for the received signals of different frequency bands.

The present invention is directed to a method of a circuit with programmable signal bandwidth, the circuit with programmable signal bandwidth using this method is applicable to receive the broadband signals, and program the bandwidth of the frequency response through a plurality of control signals.

The present invention is directed to a wireless receiver circuit having a circuit with programmable signal bandwidth, and thus the received signals can be broadband signals or signals for certain frequency bands.

The present invention provides a circuit with programmable signal bandwidth, which includes a first charge and discharge device, a first reset device, and a first variable capacitor device. The first reset device is coupled to the first charge and discharge device, and the first variable capacitor device is coupled to the first charge and discharge device. The first reset device is controlled by a discharge enable signal, for providing a first discharge path. When the discharge enable signal turns off the first reset device, the first variable capacitor device generates a first total equivalent capacitor to the first charge and discharge device according to n reference signals, and n is an integer greater than 0.

The present invention provides a method for a circuit with programmable signal bandwidth, which includes the following steps. (a) A first charge and discharge device is provided. (b) Whether or not to provide a first charge and discharge path is determined according to a discharge enable signal. (c) A first variable capacitor device coupled to first charge and discharge device is provided, in which when the first charge and discharge path is not provided, the variable capacitor device generates a first total equivalent capacitor to the first charge and discharge device according to n control signals. (d) A first signal is received, and the first charge and discharge device and the first total equivalent capacitor are charged with the first signal.

The present invention provides a wireless receiver circuit, which includes a mixer, at least one filtering and frequency down-conversion device, a first end, a second end, a first charge and discharge device, a first reset device, a first variable capacitor device, a second charge and discharge device, a second reset device, and a second variable capacitor device. The mixer is used to mix a radio frequency signal and a reference signal, so as to generate a third signal. The filtering and frequency down-conversion device has a first output end coupled to the first end and a second output end coupled to the second end. The filtering and frequency down-conversion device performs the filtering and frequency down-conversion on the third signal, so as to generate a first signal at the first output end and a second signal at the second output end. The first signal and the second signal are discrete-time signals. The first charge and discharge device is coupled to the first end, and the first reset device is coupled to the first charge and discharge device. The first reset device is controlled by the discharge enable signal, for providing a first discharge path. The first variable capacitor device is coupled to the first charge and discharge device. The second charge and discharge device is coupled to the second end, and the second reset device is coupled to the second charge and discharge device. The second reset device is controlled by the discharge enable signal, for providing a second discharge path. The second variable capacitor device is coupled to the second charge and discharge device. When the discharge enable signal turns off the first reset device, the first variable capacitor device generates a first total equivalent capacitor to the first charge and discharge device according to n reference signals. When the discharge enable signal turns off the second reset device, the second variable capacitor device generates a second total equivalent capacitor to the second charge and discharge device according to the n reference signals, and n is an integer greater than 0.

In the present invention, the variable capacitor devices and reset devices are applied, and thus the circuit and method with programmable signal bandwidth provided by the embodiments of the present invention can generate broadband frequency response, and are capable of receiving broadband wireless signals. The reset devices are capable of providing discharge paths, and thus the circuit of the present invention will not be influenced by the IIR generated due to lack of discharge path to cause the reduced bandwidth of the frequency response. In addition, the variable capacitor devices can generate total equivalent capacitors according to the control signals. Thus, the desired IIR can be generated by adjusting the control signals, thereby controlling the bandwidth of the frequency response.

In order to make the features and advantages of the present invention more clear and understandable, the following embodiments are illustrated in detail with reference to the appended drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
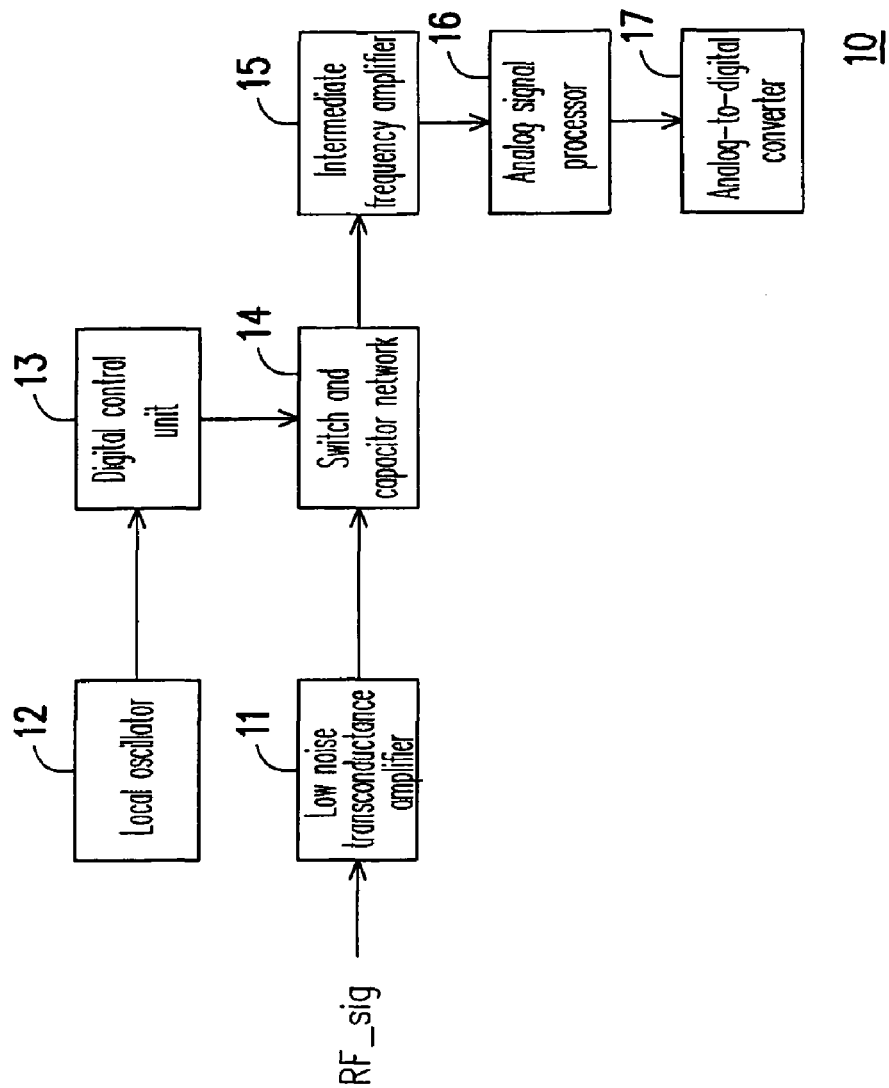
FIG. 1 is a systematic block diagram of a receiver 10 set forth by Texas Instruments.
Figure 2:
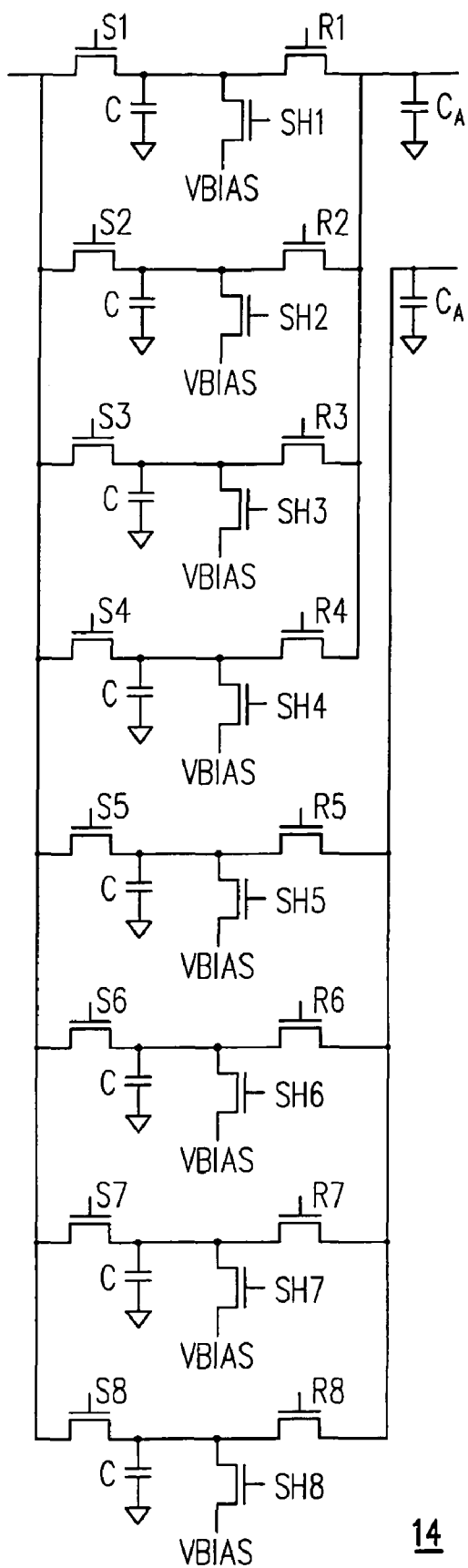
FIG. 2 is a circuit diagram of the switch and capacitor network 14 in the receiver 10.
Figure 3:
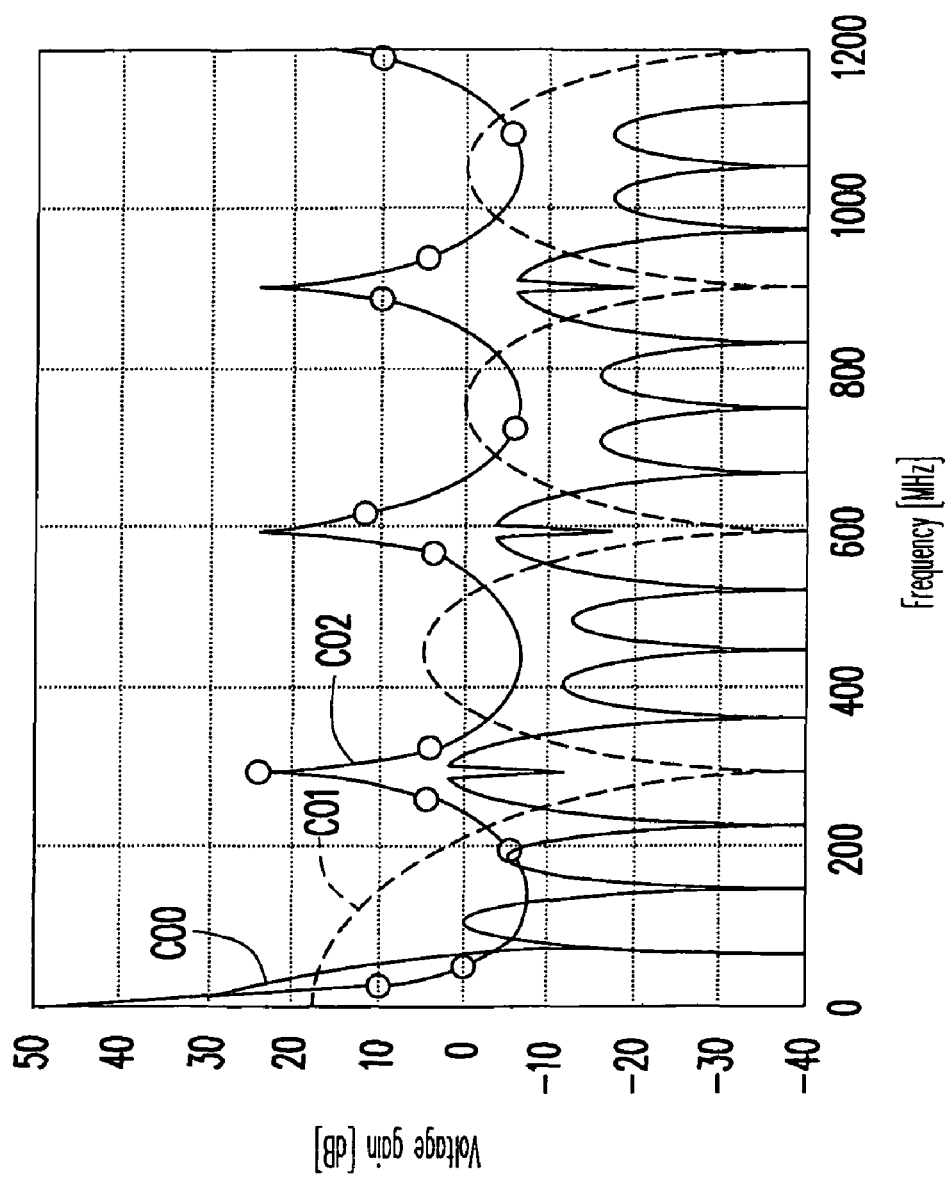
FIG. 3 is a frequency response curve diagram of the switch and capacitor network 14.
Figure 4:
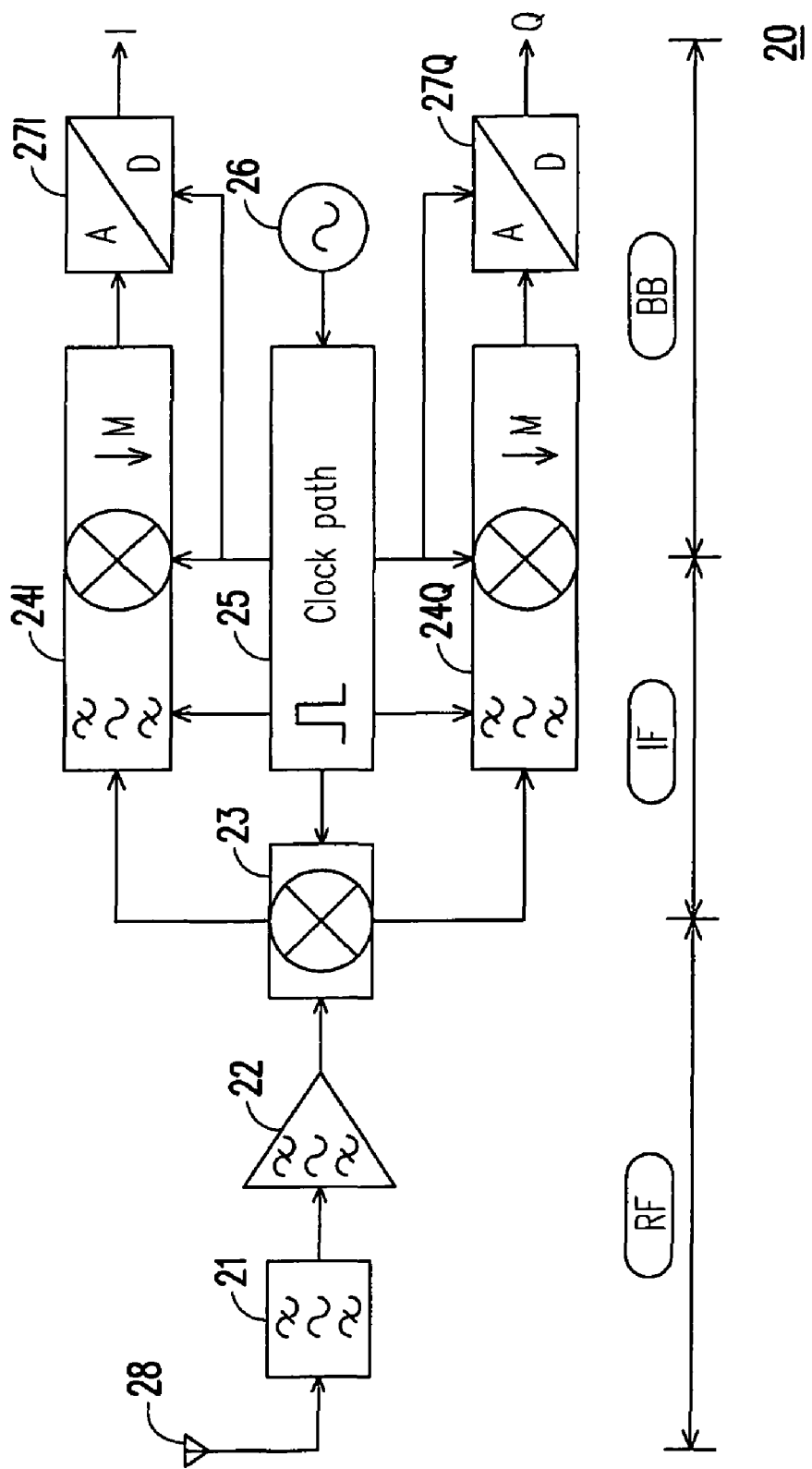
FIG. 4 is a systematic block diagram of the receiver 20 set forth by Jakonis et al.
Figure 5:
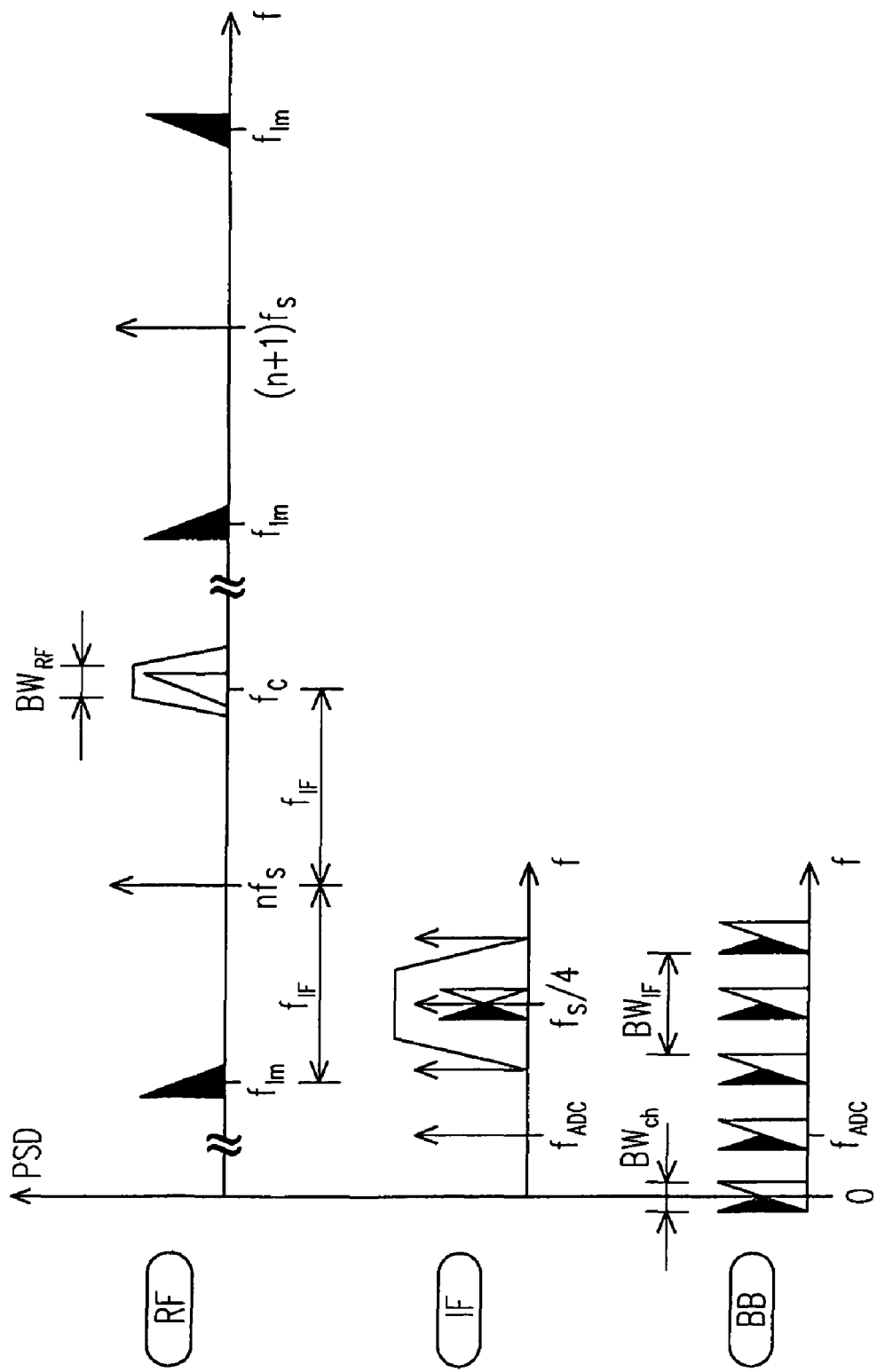
FIG. 5 is a schematic view of spectrums of every frequency operation section of the receiver 20.
Figure 6:
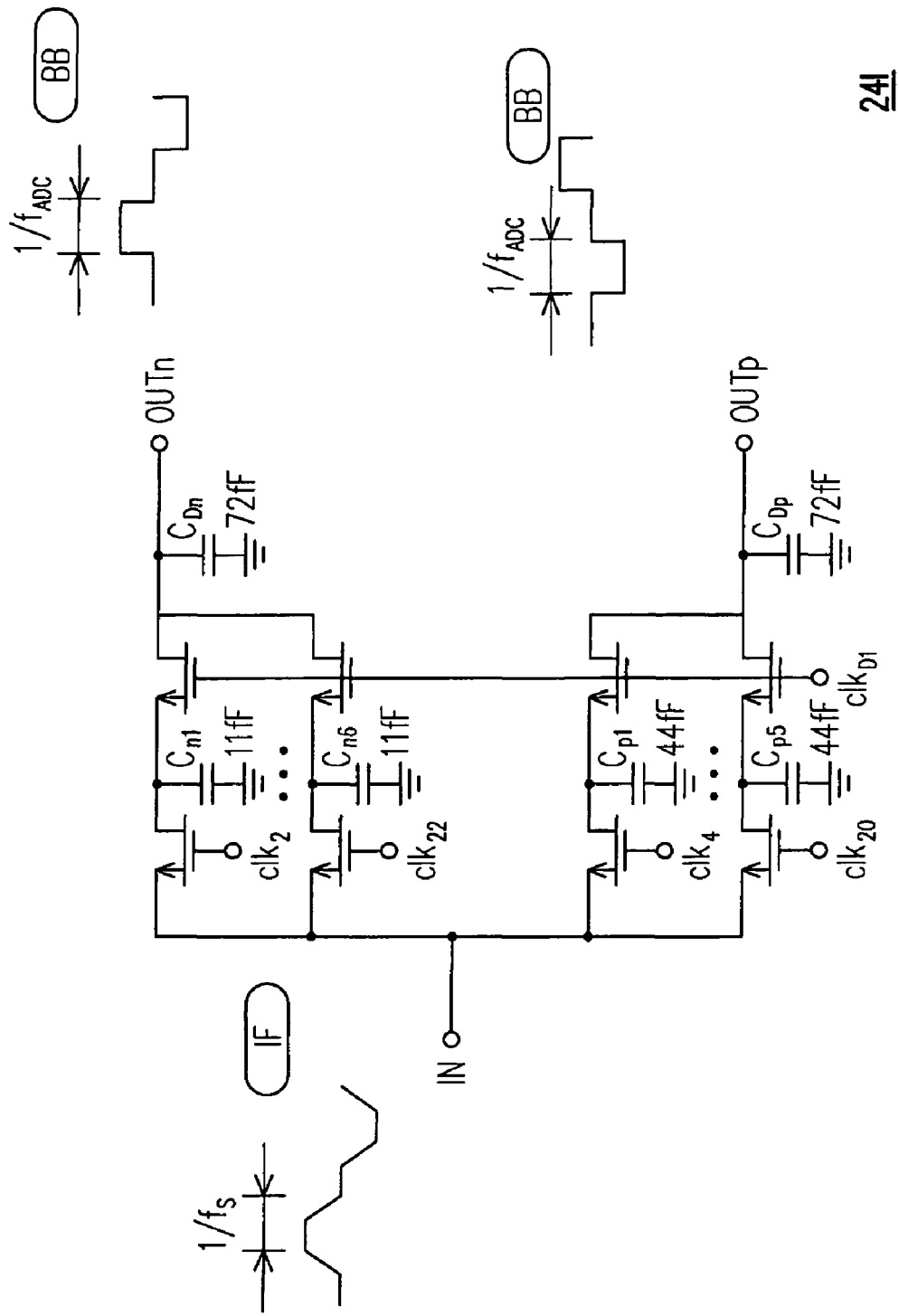
FIG. 6 is a sub circuit diagram of the filtering and frequency down-conversion devices 24I, 24Q.
Figure 7:
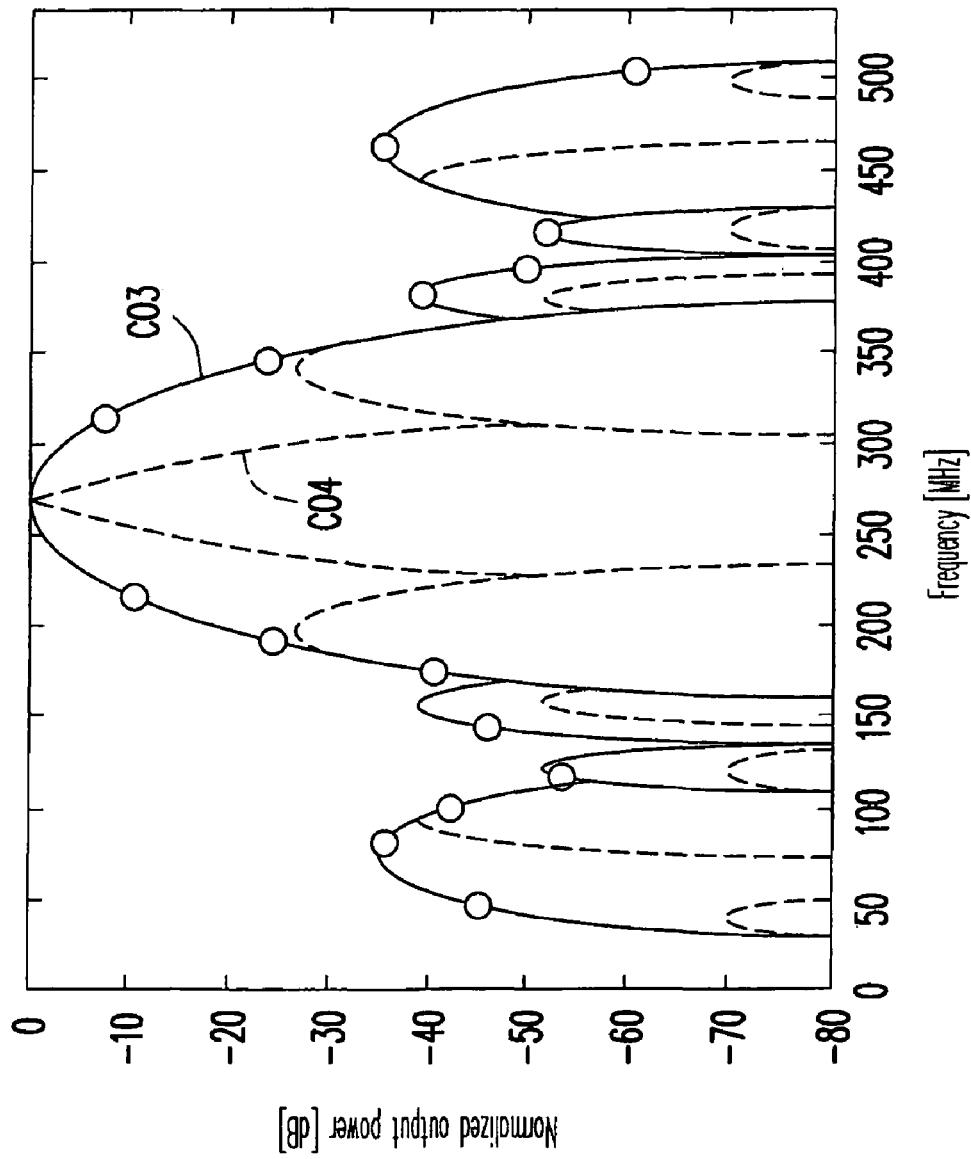
FIG. 7 a frequency response curve diagram of the receiver 20.

Reference will now be made in detail to the present embodiments of the invention, examples of which are illustrated in the accompanying drawings. Wherever possible, the same reference numbers are used in the drawings and the description to refer to the same or like parts.

In order to solve the narrowband frequency response of the conventional receiver, the present invention provides a circuit with programmable signal bandwidth and a method thereof. The circuit with programmable signal bandwidth and the method thereof are capable of receiving broadband signals and filtering the broadband signals. The bandwidth can be programmed according to different requirements.

Figure 8:
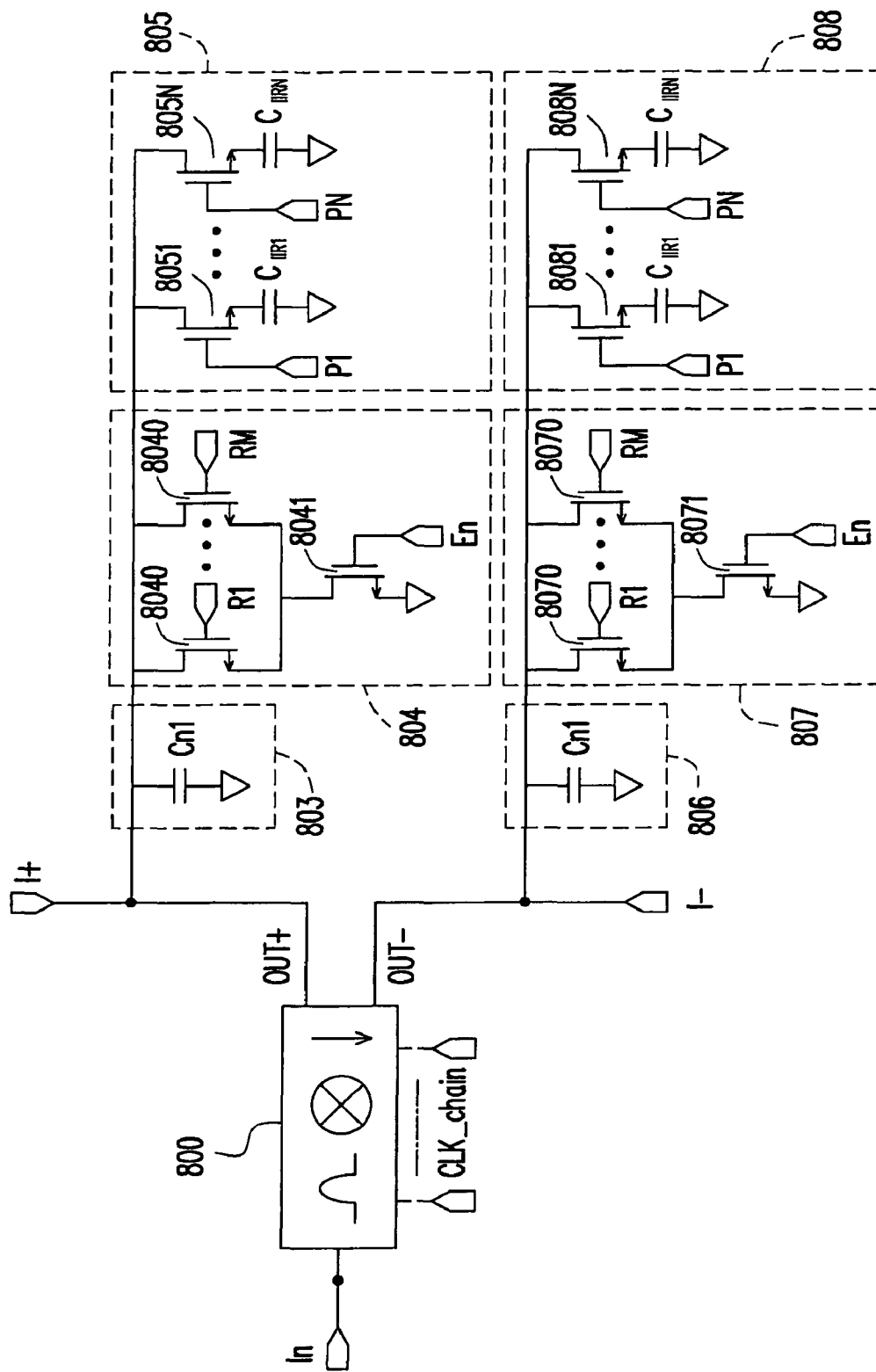
FIG. 8 is a circuit diagram of a circuit 80 with programmable signal bandwidth according to an embodiment of the present invention.

FIG. 8 is a circuit diagram of a circuit 80 with programmable signal bandwidth according to an embodiment of the present invention. As shown in FIG. 8, the circuit 80 includes at least one filtering and frequency down-conversion device 800, a first charge and discharge device 803, a first reset device 804, a first variable capacitor device 805, a second charge and discharge device 806, a second reset device 807, and a second variable capacitor device 808. The circuit 80 adopts a two-end output mode, and thus has a first end I+ and a second end I−. The first end I+ is coupled to the first charge and discharge device 803, and the second end I− is coupled to the second charge and discharge device 806. The first charge and discharge device 803 is coupled to the first reset device 804 and the first variable capacitor device 805, and the second charge and discharge device 806 is coupled to the second reset device 807 and the second variable capacitor device 808. The filtering and frequency down-conversion device 800 has a first output end OUT+ coupled to the first end I+ and a second output end OUT− coupled to the second end I−. In this embodiment, the number of the filtering and frequency down-conversion device 800 is not intended to limit the present invention. In other words, the number of the filtering and frequency down-conversion device 800 varies depending on different requirements. Further, as the two-end output mode is adopted, this embodiment adopts the first charge and discharge device 803, the first reset device 804, the first variable capacitor device 805, the second charge and discharge device 806, the second reset device 807, and the second variable capacitor device 808. If a single-end output is adopted, only the first charge and discharge device 803, the first reset device 804, and the first variable capacitor device 805 are required.

The filtering and frequency down-conversion device 800 performs the filtering and frequency down-conversion (filtering first and then down-converting the frequency) on an input signal In, so as to generate the first signal at the first output end OUT+ and a second signal at the second output end OUT−. The first charge and discharge device 803 can be a capacitor Cn1 or another electronic element having the charge and discharge mechanism, and is implemented with the capacitor Cn1 in this embodiment. Similarly, the second charge and discharge device 806 is, but not limited to, implemented with the capacitor Cn1 in this embodiment.

The first reset device 804 includes transistors 8040, 8041. Sources of the transistors 8040 are coupled to the drain of the transistor 8041, and drains of the transistors 8040 are coupled to the first charge and discharge device 803. The transistor 8041 is controlled by a discharge enable signal En. The discharge enable signal En determines whether the first reset device 804 provides a discharge path to the first charge and discharge device 803 and the first variable capacitor device 805. The transistors 8040 are controlled by reset control signals R1-RM, and the control signals R1-RM control the transistors 8040 to achieve desired discharge timing control when providing the discharge path. M is an integer greater than 0. However, it is one implementation of the first reset device 804, and is not intended to limit the present invention.

The second reset device 807 includes transistors 8070, 8071. Sources of the transistors 8070 are coupled to the drain of the transistor 8071, and drains of the transistors 8070 are coupled to the second charge and discharge device 806. The transistor 8071 is controlled by the discharge enable signal En. The discharge enable signal En determines whether the second reset device 807 provides a discharge path to the second charge and discharge device 806 and the second variable capacitor device 808. The transistors 8070 are controlled by the reset control signals R1-RM, and the control signals RL-RM control the transistors 8070 to achieve the desired discharge timing control when providing the discharge path. However, it is one implementation of the second reset device 807, and is not intended to limit the present invention.

The first variable capacitor device 805 includes N transistors 8051-805N and N capacitors $C_{IIR1}$-$C_{IIRN}$, where N is an integer greater than 0, Sources of the transistors 8051-805N are respectively coupled to the capacitors $C_{IIR1}$-$C_{IIRN}$. Drains of the transistors 8051-805N are coupled to the first charge and discharge device 803. The transistors 8051-805N are respectively controlled by N control signals P1-PN. However, the structure of the first variable capacitor device 805 is one implementation, and is not intended to limit the present invention. The first variable capacitor device 805 is used to provide a first total equivalent capacitor to the first charge and discharge device 803. That is to say, if the first reset device 804 does not provide the discharge path, the first variable capacitor device 805 provides the first total equivalent capacitor to generate first order IIR, thereby achieving the purpose of controlling the signal bandwidth. In addition, capacitances of the N capacitors $C_{IIR1}$-$C_{IIRN}$ may be different or identical, and are designed mainly depending on the bandwidth desired by the user.

The second variable capacitor device 808 includes N transistors 8081-808N and N capacitors $C_{IIR1}$-$C_{IIRN}$, where N is an integer greater than 0, Sources of the transistors 8081-808N are respectively coupled to the capacitors $C_{IIR1}$-$C_{IIRN}$. Drains of the transistors 8081-808N are coupled to the second charge and discharge device 806. The transistors 8081-808N are respectively controlled by N control signals P1-PN. However, the structure of the second variable capacitor device 808 is one implementation, and is not intended to limit the present invention. The second variable capacitor device 808 is used to provide a second total equivalent capacitor to the second charge and discharge device 806. That is to say, if the second reset device 807 does not provide the discharge path, the second variable capacitor device 808 provides the second total equivalent capacitor to generate the first order IIR, thereby achieving the purpose of controlling the signal bandwidth. In addition, capacitances of the N capacitors $C_{IIR1}$-$C_{IIRN}$ may be different or identical, and are designed mainly depending on the bandwidth desired by the user.

Assuming that the control signals P1-PN are all at a high level, when the first reset device 804 and the second reset device 807 do not provide the discharge paths, the first signal charges the first charge and discharge device 803 and the first variable capacitor device 805, and the second signal charges the second charge and discharge device 806 and the second variable capacitor device 808. At this time, the generated filtering effect is the narrowband frequency response. When the first reset device 804 and the second reset device 807 are turned on by the discharge enable signal En, the first reset device 804 and the second reset device 807 provide the discharge paths, such that the first charge and discharge device 803 and the second charge and discharge device 806, the first variable capacitor device 805, and the second variable capacitor device 808 discharge their charges from the discharge paths, so as to avoid generating the first order IIR to cause a filtering effect of narrowband frequency response. At this time, the generated filtering effect is the broadband frequency response.

When not all the control signal P1-PN are at the high level, if neither the first reset device 804 nor the second reset device 807 provides the discharge paths, the first signal charges the first charge and discharge device 803 and the first total equivalent capacitor generated by the first variable capacitor device 805 according to the control signals P1-PN. The second signal charges the second charge and discharge device 806 and the second total equivalent capacitor generated by the second variable capacitor device 808 according to the control signals P1-PN. Assuming that the control signals P1-PN are represented by 0 when being at a low level, and represented by 1 when being at the high level, the first total equivalent capacitor and the second total equivalent capacitor are $C_{eqiv}=P1*C_{IIR1}+ \ldots +PN*C_{IIRN}$. At this time, the generated frequency response will generate the first order IIR due to the influence of the first total equivalent capacitor and the second total equivalent capacitor, which reduces the bandwidth of the frequency response. Therefore, the circuit 80 is capable of programming the bandwidth of the signals through the control signals P1-PN.

Definitely, the control signals P1-PN can also be a voltage value between the high level and the low level. In this embodiment, the control signals P1-PN are, but not limited to, at the high level or the low level. When the voltage values of the control signals P1-PN are between the high level and the low level, the capacitors generated by the transistors 8051-805N, 8081-808N are different from the capacitors generated when the control signals P1-PN are merely at the high level or the low level. Therefore, different first and second total equivalent capacitors can be generated by adjusting the control signals P1-PN.

When the first reset device 804 and the second reset device 807 are turned on by the discharge enable signal En, the first reset device 804 and the second reset device 807 provide the discharge paths. The first charge and discharge device 803 and the first total equivalent capacitor discharge the charges through the discharge path. The second charge and discharge device 806 and the second total equivalent capacitor discharge the charges through the discharge path, so as to avoid generating an additional first order IIR to cause the frequency response having a bandwidth narrower than expected.

Figure 9:
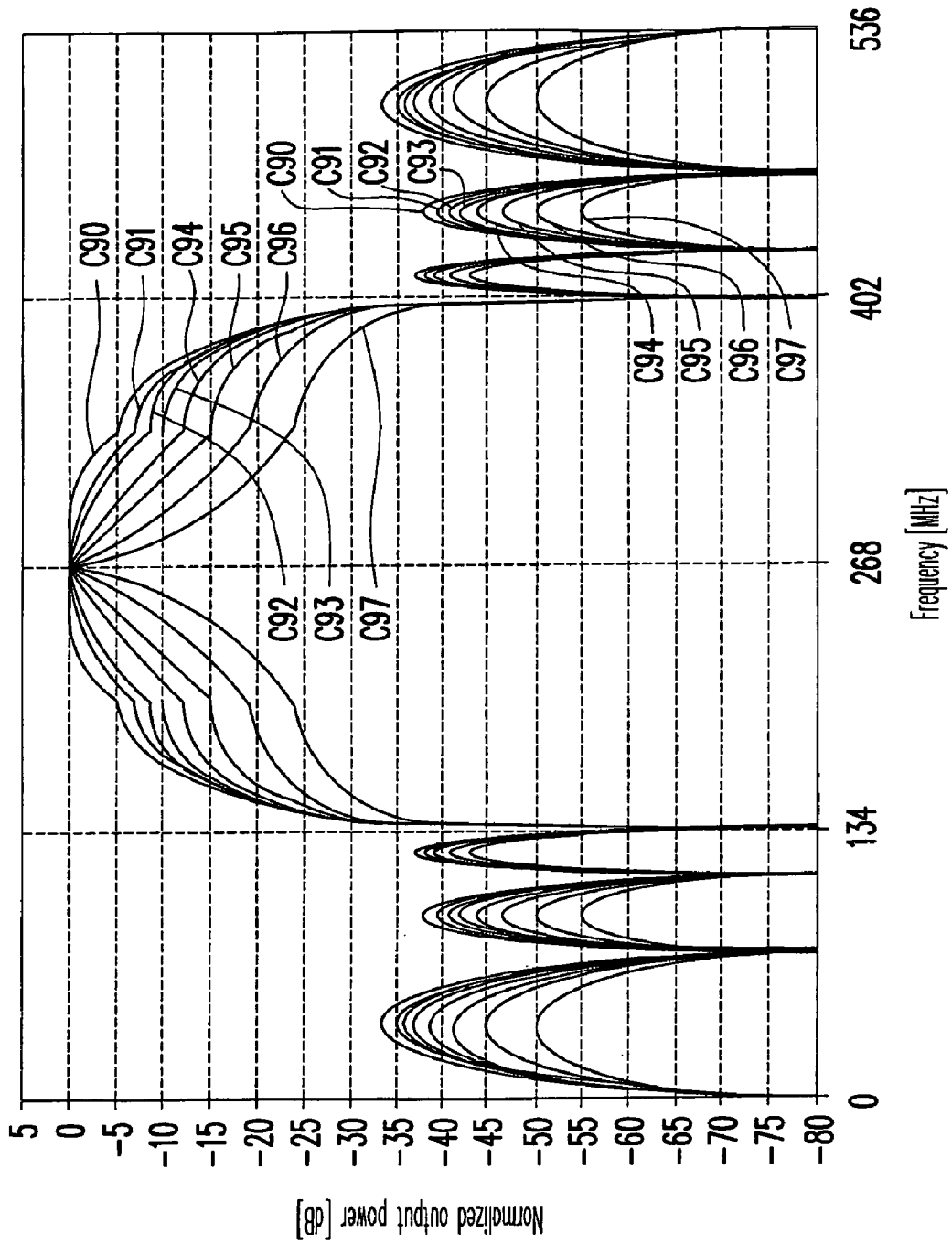
FIG. 9 a frequency response curve diagram generated by the circuit 80 with programmable signal bandwidth.

FIG. 9 is a frequency response curve diagram generated by the circuit 80. In this embodiment, N is 5, the capacitance of Cn1 is 10 fF, the capacitance of $C_{IIR1}$ is 10 fF, the capacitance of $C_{IIR2}$ is 20 fF, the capacitance of $C_{IIR3}$ is 40 fF, the capacitance of $C_{IIR4}$ is 80 fF, and the capacitance of $C_{IIR5}$ is 160 fF. When the control signals P1-P5 are all at the low level, and the first reset device 804 and the second reset device 807 provide the discharge paths, a frequency response curve C90 of the circuit 80 has a wider frequency band. When the control signals P1-P5 are all at the low level, but the first reset device 804 and the second reset device 807 do not provide the discharge path, a frequency response curve C91 of the circuit 80 thus has a narrower frequency band than that of the frequency response curve C90.

When the control signal P1 is at the high level, other control signals P2-P5 are at the low level, and the first reset device 804 and the second reset device 807 do not provide the discharge paths, a frequency response curve C92 of the circuit 80 is shown in FIG. 9. When the control signal P2 is at the high level, other control signals P1, P3-P5 are at the low level, and the first reset device 804 and the second reset device 807 do not provide the discharge paths, a frequency response curve C93 of the circuit 80 is shown in FIG. 9. When the control signal P3 is at the high level, other control signals P1, P2, P4, P5 are at the low level, and the first reset device 804 and the second reset device 807 do not provide the discharge paths, a frequency response curve C94 of the circuit 80 is shown in FIG. 9. When the control signal P4 is at the high level, other control signals P1-P3, P5 are at the low level, and the first reset device 804 and the second reset device 807 do not provide the discharge path, a frequency response curve C95 of the circuit 80 is shown in FIG. 9. When the control signal P5 is at the high level, other control signals P1-P4 are at the low level, and the first reset device 804 and the second reset device 807 do not provide the discharge paths, a frequency response curve C96 of the circuit 80 is shown in FIG. 9. When the control signals P1-P5 are all at the high level, but the first reset device 804 and the second reset device 807 do not provide the discharge paths, a frequency response curve C97 of the circuit 80 is shown in FIG. 9.

It can be known from the frequency response curve diagram of FIG. 9 that frequency response curves in different frequency bands may be generated by adjusting the control signals P1-P5. In addition, the condition of N=5 is merely an implementation, and N may be an integer greater than 0. In other words, the condition of N=5 is not used to limit the present invention. Further, when the bandwidth of the frequency response is narrowed due to the characteristics of the first order IIR, the suppressing capability on side lobe becomes better, as shown in FIG. 9, a bandwidth relation thereof is C90>C91>C92 . . . >C97, and the side lobe suppressing capability relation thereof is C90<C91<C92 . . . <C97.

Figure 10:
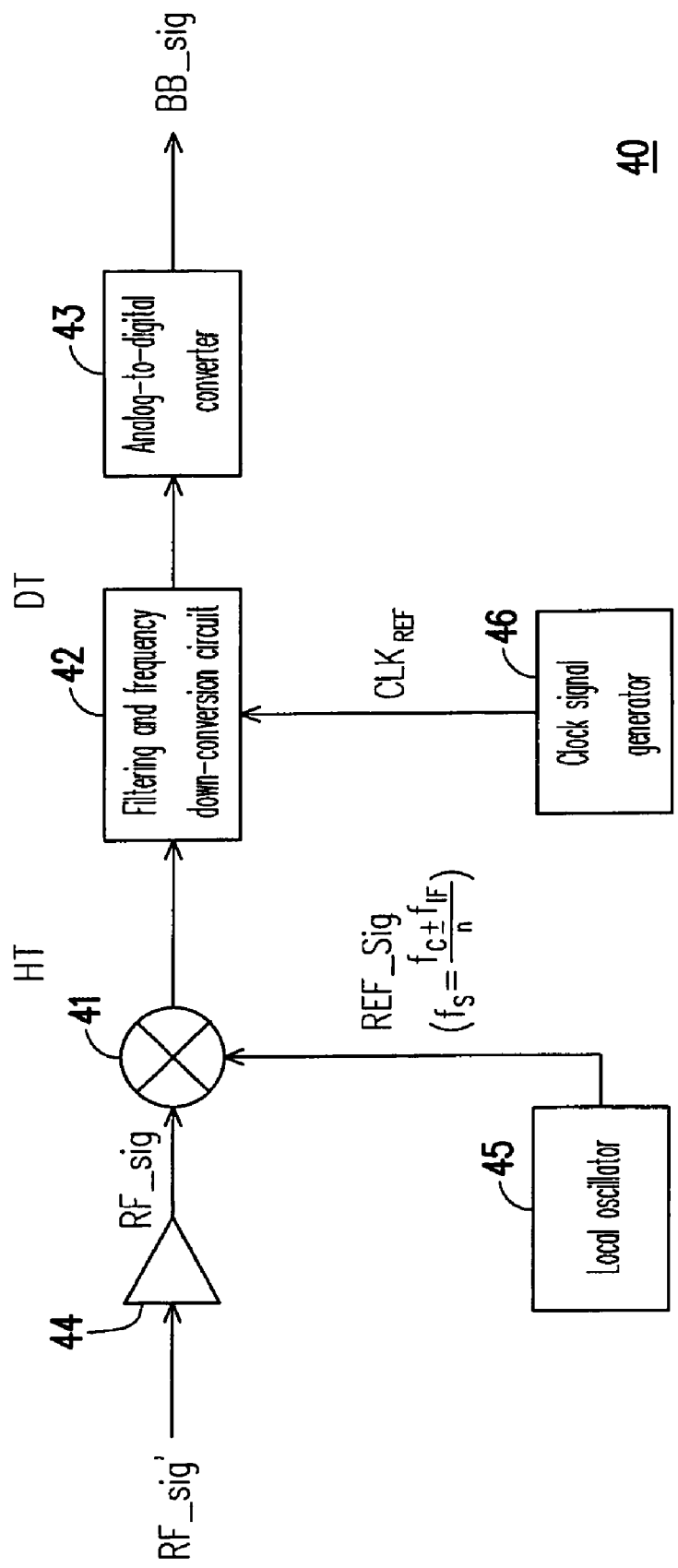
FIG. 10 is a systematic block diagram of a wireless receiver circuit according to an embodiment of the present invention.

FIG. 10 is a systematic block diagram of a wireless receiver circuit according to an embodiment of the present invention. As shown in FIG. 10, the wireless receiver circuit 40 includes a low noise amplifier 44, a mixer 41, a filtering and frequency down-conversion circuit 42, an analog-to-digital converter 43, a local oscillator 45, and a clock signal generator 46. The local oscillator 45 is coupled to the mixer 41, the mixer 41 is coupled to the low noise amplifier 44, and the filtering and frequency down-conversion circuit 42 is coupled to the analog-to-digital converter 43 and the clock signal generator 46. The filtering and frequency down-conversion circuit 42 includes the circuit 80 with programmable signal bandwidth of FIG. 8. The local oscillator 45 generates a reference signal REF_Sig, and the mixer 41 mixes the reference signal REF_Sig and the radio frequency signal RF_sig, so as to generate a third signal HT (with a frequency $f_{IF}$). The third signal HT is a continuous-time signal or a discrete-time signal. However, in this embodiment, the third signal HT is, but not limited to, a continuous-time signal.

The circuit 80 with programmable signal bandwidth performs the sampling, filtering, and frequency down-conversion on the third signal HT according to a clock signal $CLK_{REF}$, so as to generate a fourth signal DT. A relation between a frequency $f_s$ of the reference signal REF_Sig and a frequency $f_c$ of the radio frequency signal RF_sig is $f_s=(f_c\pm f_{IF})/n$, where n is a positive integer. When the frequency of the reference signal of the receiver 40 is reduced, the overall power consumption of the receiver 40 is thus reduced. Thus when n increases (i.e., the frequency $f_s$ of the reference signal is reduced), the power consumption of the receiver 40 is reduced accordingly. The low noise amplifier 44 is used to receive a radio frequency signal RF_sig' from a transmission channel, and amplifies the radio frequency signal RF_sig', so as to generate the amplified radio frequency signal RF_sig. The local oscillator 45 is used to generate the reference signal REF_Sig. As described above, the relation between the frequency $f_s$ of the reference signal REF_Sig and the frequency $f_c$ of the radio frequency signal RF_sig is $f_s=(f_c\pm f_{IF})/n$, where n is a positive integer. The clock signal generator 46 provides the clock signal CLKREF to the filtering and frequency down-conversion circuit 42. The analog-to-digital converter 43 is used to convert the fourth signal DT into the digital signal BB_sig. However, FIG. 10 is just used to illustrate an embodiment of the receiver of the present invention, instead of limiting the present invention. When the attenuation of the transmission channel is not great, the low noise amplifier 44 can be removed or be replaced by a common amplifier. In addition, directed to some special requirements, an analog signal processor can be added between the analog-to-digital converter 43 and the circuit 80 with programmable signal bandwidth, so as to perform an analog signal processing on the fourth signal DT. The local oscillator 45 and the clock signal generator 46 may be integrated together with a convention circuit therebetween, and the frequencies thereof may be different or identical. In brief, the implementations of the local oscillator 45 and the clock signal generator 46 are not used to limit the present invention. In addition, filters can be added in before or after the mixer 41 to increase the performance of the receiver 40. In brief, the receiver 40 is only an embodiment, instead of limiting the present invention.

Generally speaking, the third signal HT is an intermediate frequency signal, and the fourth signal DT is a baseband signal. However, if the required frequency $f_{IF}$ of the third signal HT is very low, the third signal HT and the fourth signal DT are all baseband signals. In other words, it is unnecessary for the receiver 40 in the above embodiment to down-convert the radio frequency signal RF_sig to the intermediate frequency signal, and then down-convert the intermediate frequency signal to the baseband signal. In some applications, the receiver can directly down-convert the radio frequency signal RF_sig to the baseband signal. Alternatively, the receiver can down-convert the radio frequency signal RF_sig to the baseband signal through the mixer or the filtering and frequency down-conversion device 800, and perform the signal process through the filtering and frequency down-conversion circuit 42, thereby achieving a better baseband signal.

The structure of the circuit 80 with programmable signal bandwidth is shown in FIG. 8, and the third signal HT will generate a first signal at the first output end and a second signal at the second output end through the filtering and frequency down-conversion device 800 in FIG. 8. The first signal and the second signal are discrete-time signals. In addition, other details are similar to those as described above, and are not described herein again.

Figure 11A:
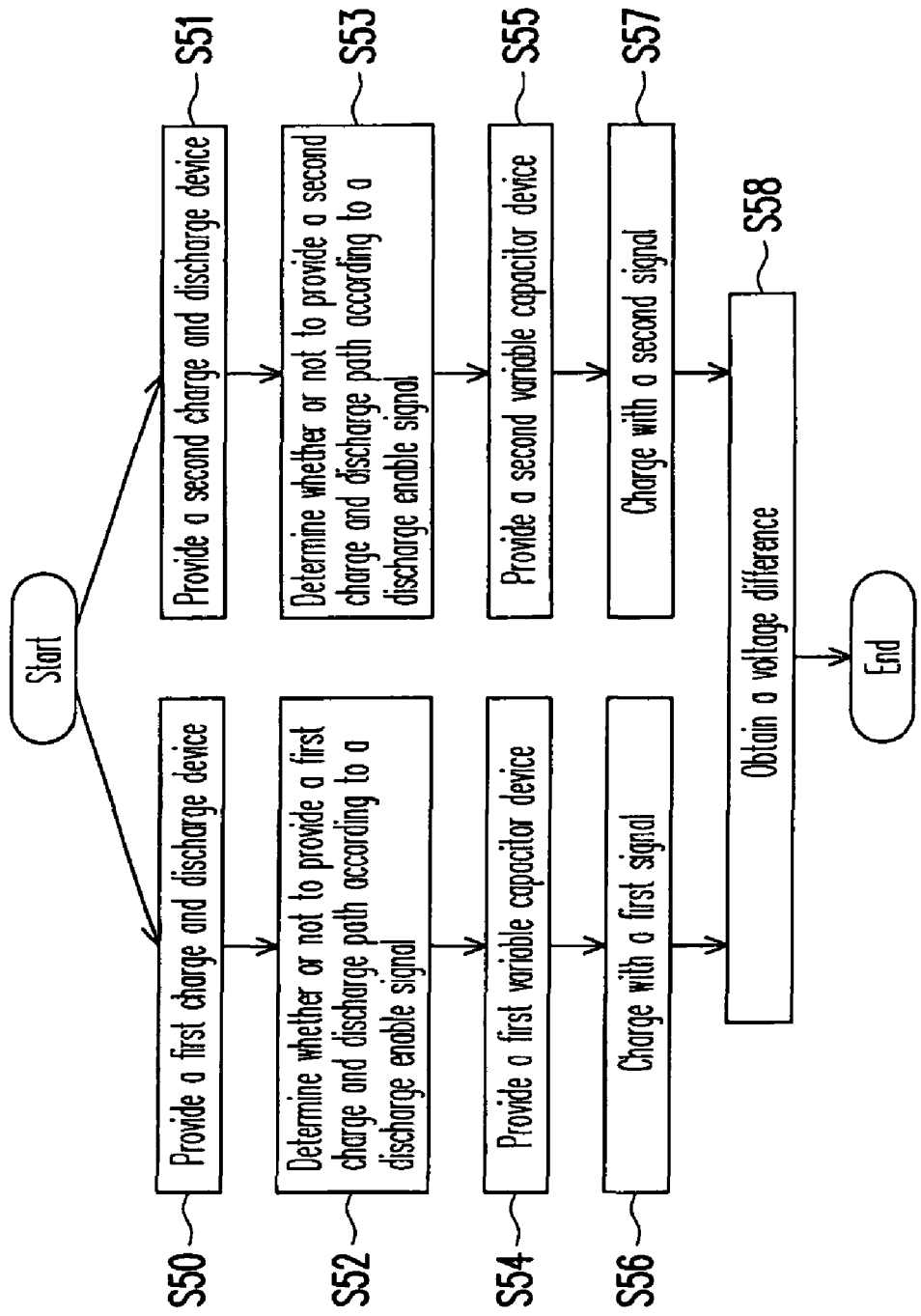
FIG. 11A is a flow chart of processes of a method of the circuit with programmable signal bandwidth according to an embodiment of the present invention.

Finally, FIG. 11A is a flow chart of processes of a method of the circuit with programmable signal bandwidth according to an embodiment of the present invention. In step S50, a first charge and discharge device is provided, and the first charge and discharge device may be a capacitor. In step S52, whether or not to provide a first charge and discharge path is determined according to a discharge enable signal, which may be implemented with the first reset device 804. In step S54, a first variable capacitor device coupled to the first charge and discharge device is provided. When the first charge and discharge path is not provided, the first variable capacitor device generates a first total equivalent capacitor to the first charge and discharge device. The first total equivalent capacitor of the first variable capacitor connects with the capacitor Cn1 of the first charge and discharge device 803 in parallel, as shown in the embodiment of FIG. 8. In step S56, a first signal is received, and the first charge and discharge device and the first total equivalent capacitor are charged with the first signal.

Figure 11B:
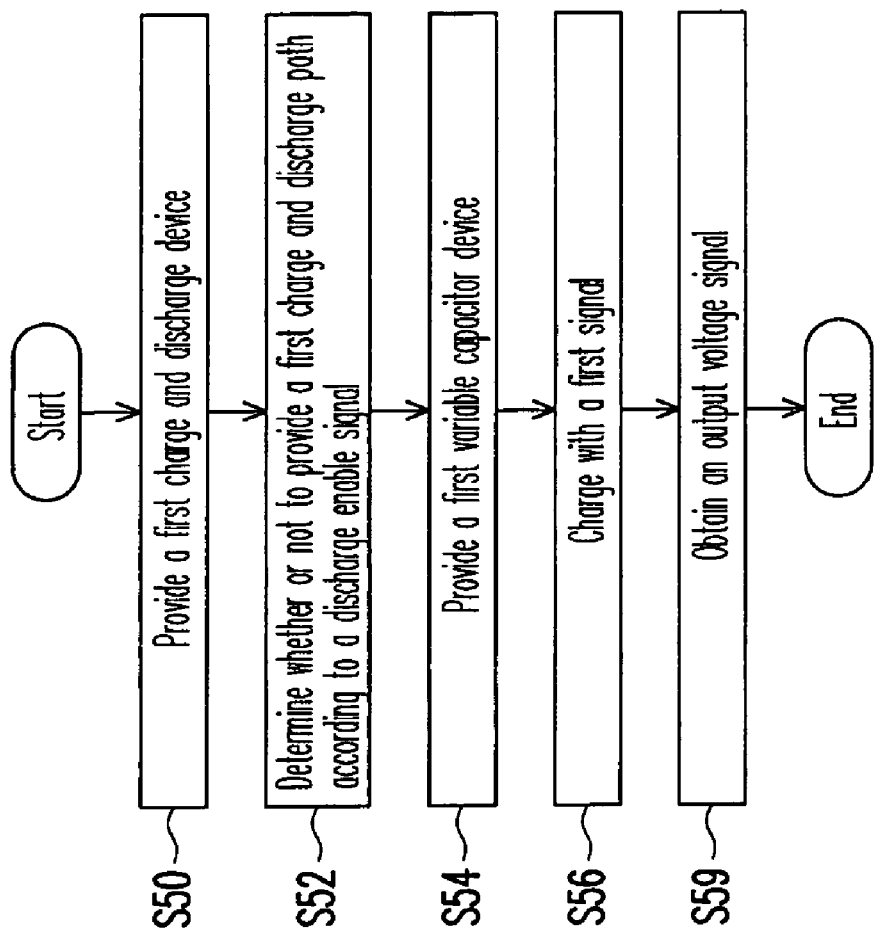
FIG. 11B is a flow chart of processes of a method of a circuit with programmable signal bandwidth according to another embodiment of the present invention.

In step S51, a second charge and discharge device is provided, and the second charge and discharge device may be implemented with a capacitor. In step S53, whether or not to provide a second charge and discharge path is determined according to the discharge enable signal, which may be implemented with the second reset device 807. In step S55, a second variable capacitor device coupled to the second charge and discharge device is provided. When the second charge and discharge path is not provided, the second variable capacitor device generates a second total equivalent capacitor to the second charge and discharge device. The second total equivalent capacitor of the second variable capacitor connects with the capacitor Cn1 of the second charge and discharge device 806 in parallel, as shown in the embodiment of FIG. 8. In step S57, a second signal is received, and the second charge and discharge device and the second total equivalent capacitor are charged with the second signal. Finally, in step S58, a voltage difference between the first charge and discharge device and the second charge and discharge device is obtained as an output signal. The flow chart of FIG. 11A is an embodiment provided directing to the two-end output mode, instead of limiting the present invention. If a single output mode is applied, refer to FIG. 11B. FIG. 11 is a flow chart of processes of a method of a circuit with programmable signal bandwidth according to another embodiment of the present invention. As shown in FIG. 11B, since the single output mode is applied, steps S50, S52, S54, and S56 of FIG. 11B are identical to those of FIG. 11A, and thus will not be described herein. In step S59, since the single output mode is applied, only the output voltage signal of the first charge and discharge device is required to be obtained, which is different from the step S58 of FIG. 11A of obtaining the voltage difference of the first and second charge and discharge devices.

In view of the above, the present invention provides discharge paths to the charge and discharge devices according to the discharge enable signal, so as to avoid the first order IIR generated due to the lack of discharge path, and is capable of providing a broadband frequency response. In addition, the present invention controls the total equivalent capacitors generated by the variable capacitor devices through the control signals, such that the bandwidth of the frequency response may be controlled by the control signals.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit with programmable signal bandwidth, comprising:
    a first charge and discharge device;
    a first reset device, coupled to the first charge and discharge device, controlled by a discharge enable signal, for providing a first discharge path; and
    a first variable capacitor device, coupled to the first charge and discharge device,
    wherein when the discharge enable signal turns off the first reset device, the first variable capacitor device generates a first total equivalent capacitor to the first charge and discharge device according to n control signals, and n is an integer greater than 0; and
    when the discharge enable signal turns on the first reset device, the first reset device provides the first charge and discharge device and the first variable capacitor device with the first discharge path for discharging charges stored in the first charge and discharge device and the first variable capacitor device from the first discharge path.

2. The circuit with programmable signal bandwidth according to claim 1, further comprising:
    a first end, coupled to the first charge and discharge device;
    a second end;
    a second charge and discharge device, coupled to the second end;
    a second reset device, coupled to the second charge and discharge device, controlled by the discharge enable signal, for providing a second discharge path; and
    a second variable capacitor device, coupled to the second charge and discharge device;
    wherein when the discharge enable signal turns off the second reset device, the second variable capacitor device generates a second total equivalent capacitor to the second charge and discharge device according to the n control signals.

3. The circuit with programmable signal bandwidth according to claim 2, wherein the first reset device comprises:
    at least one first transistor, with a drain coupled to the first charge and discharge device, and controlled by at least one reset control signal; and
    a second transistor, coupled to a source of the first transistor, and controlled by the discharge enable signal.

4. The circuit with programmable signal bandwidth according to claim 2, wherein the second reset device comprises:
    at least one third transistor, with a drain coupled to the second charge and discharge device, and controlled by at least one reset control signal; and
    a fourth transistor, coupled to a source of the third transistor, and controlled by the discharge enable signal.

5. The circuit with programmable signal bandwidth according to claim 2, wherein the first variable capacitor device comprises:

n fifth transistors, with drains coupled to the first reset device, and respectively controlled by the n control signals; and n first capacitors, coupled to sources of the n fifth transistors.

6. The circuit with programmable signal bandwidth according to claim 5, wherein the second variable capacitor device comprises:

n sixth transistors, with drains coupled to the second reset device, and respectively controlled by the n control signals; and n second capacitors, coupled to sources of the n sixth transistors;

wherein capacitances of the n first capacitors are different or identical, and capacitances of the n second capacitors are different or identical.

7. The circuit with programmable signal bandwidth according to claim 2, wherein the first charge and discharge device is a third capacitor, and the second charge and discharge device is a fourth capacitor.

8. The circuit with programmable signal bandwidth according to claim 2, further comprising:

at least one filtering and frequency down-conversion device, with a first output end coupled to the first end and a second output end coupled to the second end, for performing a filtering and frequency down-conversion on a third signal, wherein the third signal becomes a discrete-time signal after the filtering and frequency down-conversion.

9. The circuit with programmable signal bandwidth according to claim 8, further comprising:

a mixer, coupled to the filtering and frequency down-conversion device, for mixing a radio frequency signal and a control signal to generate the third signal, wherein the third signal is a continuous-time signal or a discrete-time signal, the reference signal has a frequency $f_s=(f_c \pm f_{IF})/k$, $f_c$ is the frequency of the radio frequency signal, $f_{IF}$ is the frequency of the third signal, and k is an integer greater than 0.

10. The circuit with programmable signal bandwidth according to claim 9, wherein the third signal is an intermediate frequency signal or a baseband signal.

11. A method for a circuit with programmable signal bandwidth, comprising:

providing a first charge and discharge device;

determining whether or not to provide a first charge and discharge path according to a discharge enable signal;

providing a first variable capacitor device coupled to the first charge and discharge device, wherein when the first charge and discharge path is not provided, the variable capacitor device generates a first total equivalent capacitor to the first charge and discharge device according to n control signals, and n is an integer greater than 0, and when the first charge and discharge path is provided, charges stored in the first charge and discharge device and the first variable capacitor device are discharged through the first charge and discharge path; and receiving a first signal, and charging the first charge and discharge device and the first total equivalent capacitor with the first signal.

12. The method for a circuit with programmable signal bandwidth according to claim 11, further comprising:

receiving a second signal and providing a second charge and discharge device;

determining whether or not to provide a second charge and discharge path according to the discharge enable signal;

providing a second variable capacitor device coupled to the second charge and discharge device, wherein when the second charge and discharge path is not provided, the variable capacitor device generates a second total equivalent capacitor to the second charge and discharge device according to the n control signals;

receiving a second signal, and charging the second charge and discharge device and the second total equivalent capacitor with the second signal; and obtaining an output voltage difference between the first charge and discharge device and the second charge and discharge device.

13. The method for a circuit with programmable signal bandwidth according to claim 12, wherein the first variable capacitor device comprises:

n fifth transistors, with drains coupled to the first reset device, and respectively controlled by the n control signals; and n first capacitors, coupled to sources of the n fifth transistors.

14. The method for a circuit with programmable signal bandwidth according to claim 13, wherein the second variable capacitor device comprises:

n sixth transistors, with drains coupled to the second reset device, and respectively controlled by the n control signals; and n second capacitors, coupled to sources of the n sixth transistors;

wherein capacitances of the n first capacitors are different or identical, and capacitances of the n second capacitors are different or identical.

15. The method for a circuit with programmable signal bandwidth according to claim 12, wherein the first charge and discharge device is a third capacitor, and the second charge and discharge device is a fourth capacitor.

16. The method for a circuit with programmable signal bandwidth according to claim 13, further comprising:

performing a filtering and frequency down-conversion on a third signal, so as to generate the first signal and the second signal.

17. The method for a circuit with programmable signal bandwidth according to claim 16, further comprising:

mixing a radio frequency signal and a reference signal, so as to generate the third signal, wherein the third signal is a continuous-time signal or a discrete-time signal.

18. The method for a circuit with programmable signal bandwidth according to claim 17, wherein the third signal is an intermediate frequency signal or a baseband signal.

19. A wireless receiver circuit, comprising:

a mixer, for mixing a radio frequency signal and a reference signal to generate a third signal, wherein the third signal is a continuous-time signal or a discrete-time signal, the frequency of the reference signal is $f_s=(f_c \pm f_{IF})/k$, $f_c$ is the frequency of the radio frequency signal, $f_{IF}$ is the frequency of the third signal, and k is an integer greater than 0;

at least one filtering and frequency down-conversion device, comprising a first output end and a second output end, for performing the filtering and frequency down-conversion on a third signal, so as to generate a first signal at the first output end and a second signal at the second output end, wherein the first signal and the second signal are discrete-time signals;

a first end and a second end, respectively coupled to the first output end and the second output end;

a first charge and discharge device, coupled to the first end;

a first reset device, coupled to the first charge and discharge device, controlled by a discharge enable signal, for providing a first discharge path;

a first variable capacitor device, coupled to the first charge and discharge device;

a second charge and discharge device, coupled to the second end;

a second reset device, coupled to the second charge and discharge device, controlled by the discharge enable signal, for providing a second discharge path; and a second variable capacitor device, coupled to the second charge and discharge device;

wherein when the discharge enable signal turns off the first reset device, the first variable capacitor device generates a first total equivalent capacitor to the first charge and discharge device according to n reference signals; when the discharge enable signal turns off the second reset device, the second variable capacitor device generates a second total equivalent capacitor to the second charge and discharge device according to the n reference signals, and n is an integer greater than 0.

20. The wireless receiver circuit according to claim 19, wherein the first reset device comprises:

at least one first transistor, with a drain coupled to the first charge and discharge device, and controlled by at least one reset control signal; and a second transistor, coupled to a source of the first transistor, and controlled by the discharge enable signal.

21. The wireless receiver circuit according to claim 19, wherein the second reset device comprises:

at least one third transistor, with a drain coupled to the second charge and discharge device, and controlled by at least one reset control signal; and a fourth transistor, coupled to a source of the third transistor, and controlled by the discharge enable signal.

22. The wireless receiver circuit according to claim 19, wherein the first variable capacitor device comprises:

n fifth transistors, with drains coupled to the first reset device, and respectively controlled by the n control signals; and n first capacitors, coupled to sources of the n fifth transistors.

23. The wireless receiver circuit according to claim 22, wherein the second variable capacitor device comprises:

n sixth transistors, with drains coupled to the second reset device, and respectively controlled by the n control signals; and n second capacitors, coupled to sources of the n sixth transistors;

wherein capacitances of the n first capacitors are different or identical, and capacitances of the n second capacitors are different or identical.

24. The wireless receiver circuit according to claim 19, wherein the first charge and discharge device is a third capacitor, and the second charge and discharge device is a fourth capacitor.

25. The wireless receiver circuit according to claim 19, wherein the third signal is an intermediate frequency signal or a baseband signal.

* * * * *